United States Patent
Hemati et al.

(10) Patent No.: US 10,084,364 B2
(45) Date of Patent: Sep. 25, 2018

(54) POWER MINIMIZING CONTROLLER FOR A STAGE ASSEMBLY

(71) Applicant: NIKON CORPORATION, Tokyo (JP)

(72) Inventors: Neyram Hemati, Saratoga, CA (US); Michael Binnard, Belmont, CA (US)

(73) Assignee: Nikon Research Corporation of America, Belmont, CA (US)

( * ) Notice: Subject to any disclaimer, the term of this patent is extended or adjusted under 35 U.S.C. 154(b) by 82 days.

(21) Appl. No.: 14/505,852

(22) Filed: Oct. 3, 2014

(65) Prior Publication Data

US 2015/0097498 A1    Apr. 9, 2015

Related U.S. Application Data

(60) Provisional application No. 61/887,366, filed on Oct. 5, 2013.

(51) Int. Cl.
*H02K 41/025* (2006.01)
*H02K 3/47* (2006.01)
(Continued)

(52) U.S. Cl.
CPC ....... *H02K 41/033* (2013.01); *G03F 7/70725* (2013.01); *G03F 7/70758* (2013.01);
(Continued)

(58) Field of Classification Search
CPC ............................. H02K 41/02; H02K 16/00
See application file for complete search history.

(56) References Cited

U.S. PATENT DOCUMENTS

| | | | | |
|---|---|---|---|---|
| 4,506,205 A | * | 3/1985 | Trost | G03F 7/70716 269/58 |
| 6,127,749 A | * | 10/2000 | Sogard | G03F 7/70758 310/12.06 |

(Continued)

FOREIGN PATENT DOCUMENTS

| WO | WO2010041771 A3 | 4/2010 |
|---|---|---|
| WO | WO2013112759 A1 | 8/2013 |
| WO | WO2013112761 A2 | 8/2013 |

OTHER PUBLICATIONS

Krone, et al., "Investigation of the magnetization reversal of a magnetic dot array of Co/Pt multilayers", J. Nanopart Res, 13:5587-5593 (2011).

(Continued)

*Primary Examiner* — Charles S Laughlin
(74) *Attorney, Agent, or Firm* — Roeder & Broder LLP; Steven G. Roeder

(57) ABSTRACT

A method for moving a stage includes coupling a stage mover to the stage, and directing current to the stage mover with a control system. The stage mover includes a magnet array and a conductor array positioned adjacent to the magnet array. The conductor array includes a first layer of coils and a second layer of coils, with the first layer of coils being closer to the magnet array than the second layer of coils. The control system directs current to the first layer of coils and the second layer of coils independently. Further, the control system directs more current to the first layer of coils than the second layer of coils during a movement step to reduce the power consumption.

20 Claims, 11 Drawing Sheets

(51) Int. Cl.
*H02K 3/02* (2006.01)
*H02K 41/03* (2006.01)
*H01L 21/00* (2006.01)
*G03F 7/20* (2006.01)
*H02K 16/00* (2006.01)

(52) U.S. Cl.
CPC ........... *H01L 21/00* (2013.01); *H02K 41/031* (2013.01); *H02K 16/00* (2013.01)

(56) References Cited

U.S. PATENT DOCUMENTS

| | | | |
|---|---|---|---|
| 6,841,956 B2* | 1/2005 | Hazelton | G03F 7/70716 310/12.04 |
| 6,856,063 B1 | 2/2005 | Kelecy et al. | |
| 7,355,308 B2* | 4/2008 | Hazelton | G03F 7/70758 310/12.06 |
| 7,923,884 B2 | 4/2011 | Seguchi et al. | |
| 2003/0209431 A1 | 11/2003 | Brown | |
| 2010/0167556 A1* | 7/2010 | Totsu | H02K 41/03 438/795 |

OTHER PUBLICATIONS

The International Search Report and Written Opinion of the International Searching Authority, Nikon Corporation, dated Mar. 29, 2013, PCT/US13/23020.

The International Search Report and Written Opinion of the International Searching Authority, Nikon Corporation, dated Mar. 27, 2013, PCT/US13/23023.

* cited by examiner

POWER MINIMIZING CONTROLLER FOR A STAGE ASSEMBLY

CROSS-REFERENCE TO RELATED APPLICATION

This application claims priority on U.S. Provisional Application Ser. No. 61/887,366 filed on Oct. 5, 2013 and entitled "POWER MINIMIZING CONTROLLER". As far as is permitted, the contents of U.S. Provisional Application Ser. No. 61/887,366 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly, a wafer stage assembly that retains a semiconductor wafer, a metrology system that monitors the position of the stage assemblies, and a control system that controls the stage assemblies based on the position information from the metrology system. Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle.

Unfortunately, the stage mover assemblies generate heat that can adversely influence the other components of the exposure apparatus. For example, the heat can distort certain components and/or adversely influence the measurements taken by the metrology system. Conventionally, the stage mover assemblies are cooled by forcing a coolant around the movers of the stage mover assembly. However, it is often very difficult to adequately or efficiently cool the stage mover assemblies. Accordingly, there is a never ending goal to improve the efficiency of the stage mover assemblies to reduce the amount of heat generated by the stage mover assemblies.

SUMMARY

The present invention is directed to a method for moving a stage that includes the steps of coupling a stage mover to the stage, and directing current to the stage mover. The stage mover can include a magnet array and a conductor array positioned adjacent to the magnet array, the conductor array including a first layer of conductors (e.g. coils) and a second layer of conductors (e.g. coils), wherein the first layer of coils is closer to the magnet array than the second layer of coils. The present invention directs current to the first layer of coils and the second layer of coils independently with a control system. In certain embodiments, the control system directs more current to the first layer of coils than the second layer of coils during a movement step to reduce the power consumption.

As provided herein, the problem of minimizing the power losses (heat dissipation) in a stage mover that includes at least two layers of coils is solved by an algorithm that provides the optimum ratio between the currents in the coil windings.

As non-exclusive examples, the stage mover can be a planar or a linear motor.

The present invention is also directed to a stage mover assembly and an exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
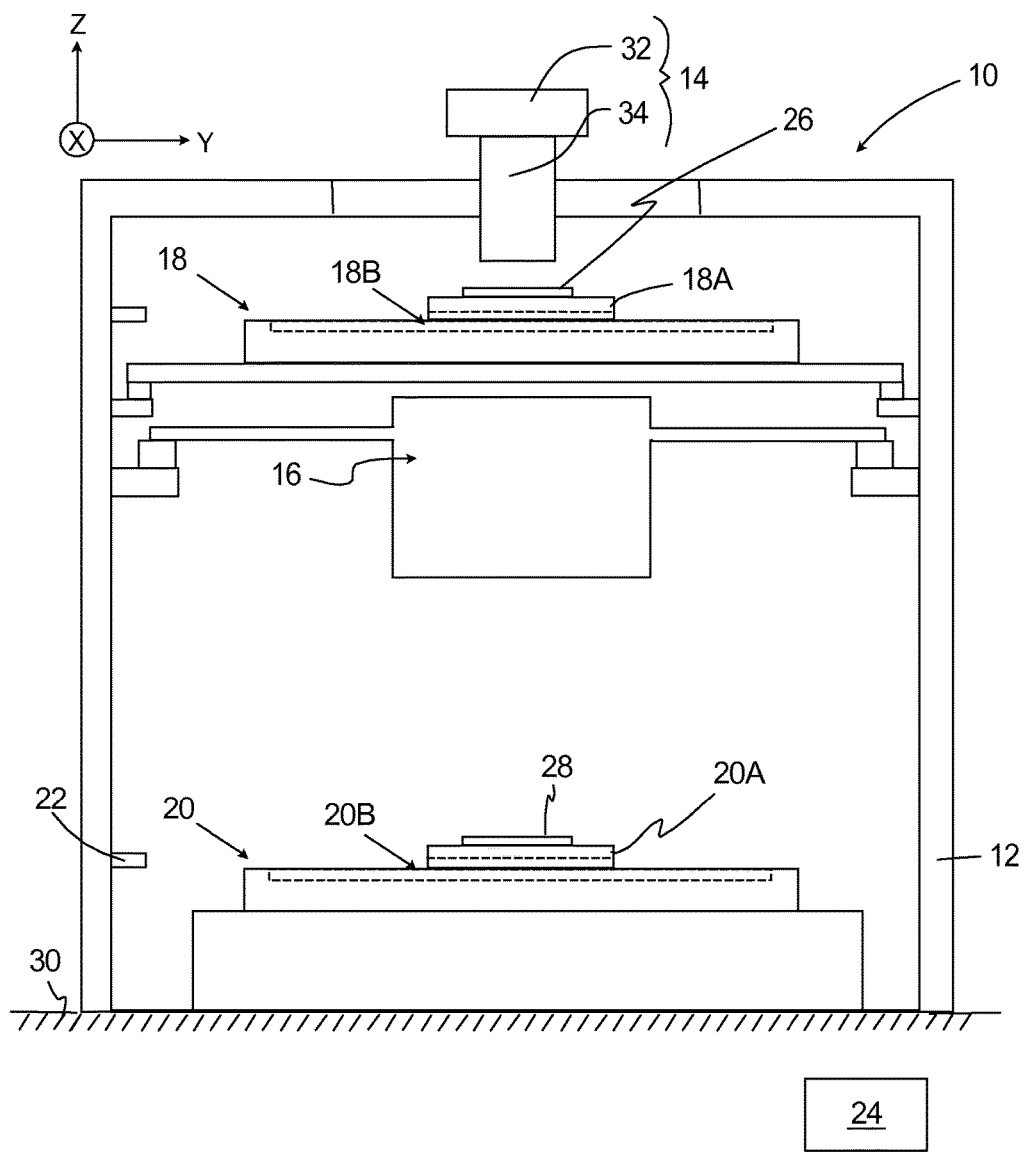
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16 (lens assembly), a reticle stage assembly 18, a wafer stage assembly 20, a metrology ("measurement") system 22, and a control system 24 (sometimes referred to as a "controller"). The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be understood that the orientation system is merely for reference and can be varied. For example, the X axis can be switched with the Y axis and/or the exposure apparatus 10 can be rotated. Moreover, it should be noted that any of these axes can also be referred to as the first, second, and/or third axes.

As an overview, the control system 24 is uniquely designed to control and drive one or both of the stage assemblies 18, 20 in a more efficient fashion. Stated in another fashion, the control system 24 controls the stage assemblies 18, 20 in a fashion that minimizes the amount of resistive power loss. As a result thereof, less heat is generated and less power is consumed, and less cooling is required to maintain the temperature of the stage assemblies 18, 20. Further, the control system 24 provided herein is relatively simple to implement.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, a floor or some other supporting structure.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. Alternatively, the exposure apparatus 10 can be a step-and-repeat type photolithography system that exposes the reticle 26 while the reticle 26 and the wafer 28 are both stationary.

However, the use of the exposure apparatus 10 and stage assemblies provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

The apparatus frame 12 is rigid and supports the components of the exposure apparatus 10. The design of the apparatus frame 12 can be varied to suit the design requirements of the rest of the exposure apparatus 10. The apparatus frame 12 illustrated in FIG. 1 supports the optical assembly 16, the reticle stage assembly 18, the wafer stage assembly 20, and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam of light energy selectively illuminates different portions of the reticle 26 and exposes the wafer 28.

The illumination source 32 can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

The reticle stage assembly 18 holds and positions the reticle 26 relative to the optical assembly 16 and the wafer 28. In FIG. 1, the reticle stage assembly 18 includes the reticle stage 18A that retains the reticle 26, and a reticle stage mover assembly 18B that positions the reticle stage 18A and the reticle 26. The reticle stage mover assembly 18B can be designed to move the reticle 26 along the X and Y axes, and about the Z axis. Alternatively, the reticle stage mover assembly 18B can be designed to move the reticle 26 along the X, Y and Z axes, and about the X, Y and Z axes.

Somewhat similarly, the wafer stage assembly 20 holds and positions the wafer 28 with respect to the projected image of the illuminated portions of the reticle 26. In FIG. 1, the wafer stage assembly 20 includes the wafer stage 20A that retains the wafer 28, and a wafer stage mover assembly 20B that positions the wafer stage 20A and the wafer 28. The wafer stage mover assembly 20B can be designed to move the wafer 28 along the X and Y axes, and about the Z axis. Alternatively, the wafer stage mover assembly 20B can be designed to move the wafer 28 along the X, Y and Z axes, and about the X, Y and Z axes.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, autofocus systems, and/or other measuring devices.

The control system 24 is electrically connected to the reticle stage assembly 18, the wafer stage assembly 20, and the measurement system 22. The control system 24 receives information from the measurement system 22 and controls the stage assemblies 18, 20 to precisely position the reticle 26 and the wafer 28. The control system 24 can include one or more processors and circuits.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2:
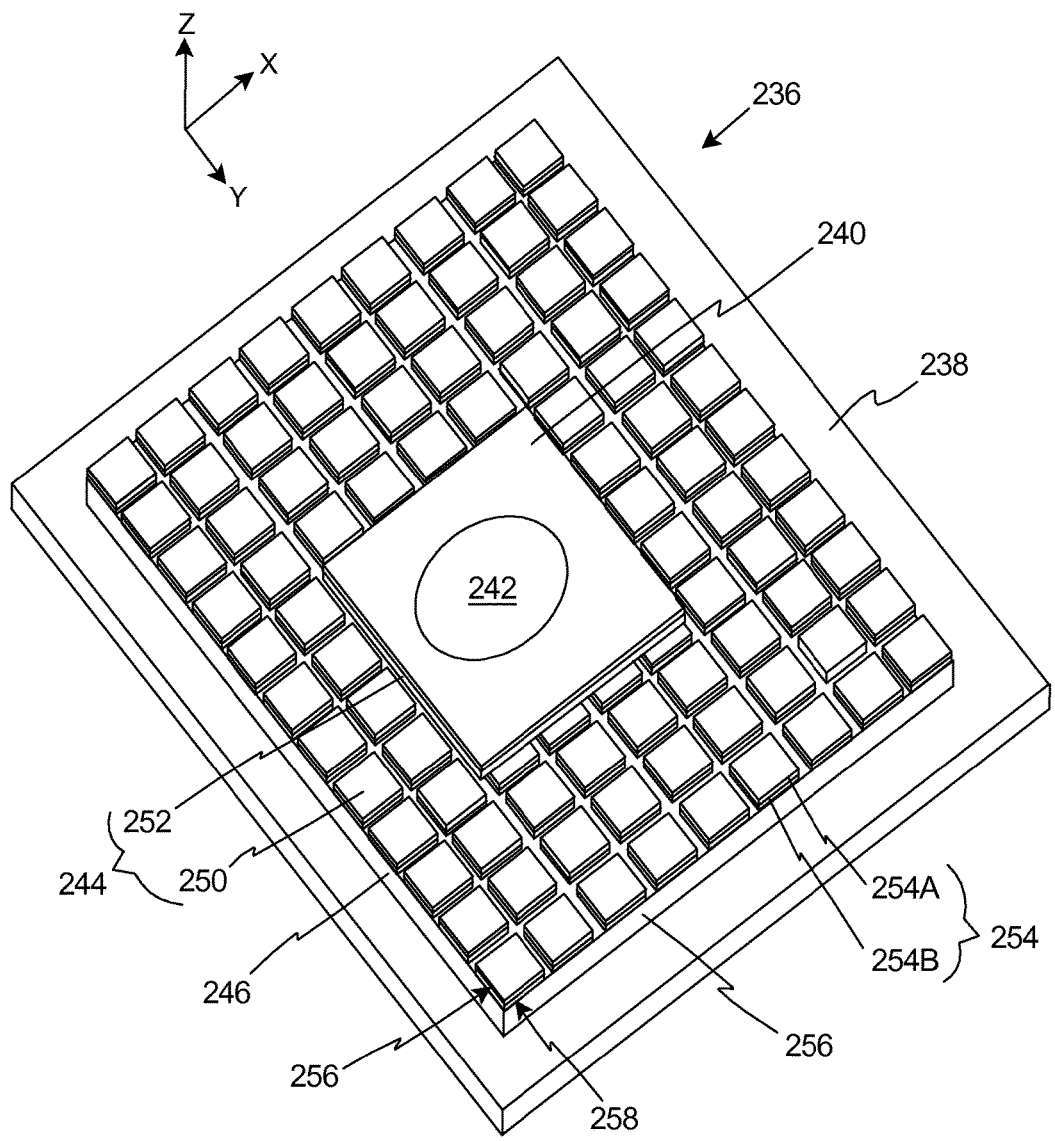
FIG. 2 is a perspective view of an embodiment of a stage assembly that can be included as part of the exposure apparatus of FIG. 1.

FIG. 2 is a perspective view of an embodiment of a stage assembly 236 having features of the present invention. In various applications, the stage assembly 236 can be utilized as the reticle stage assembly 18 and/or the wafer stage assembly 20 of the exposure apparatus 10 illustrated above in FIG. 1. Alternatively, the stage assembly 236 can be used for other types of usages.

As illustrated in this embodiment, the stage assembly 236 includes a stage base 238, a stage 240 that retains a device 242, a stage mover 244 (e.g. a planar motor), a countermass reaction assembly 246 (also referred to herein simply as a "reaction assembly"), and a control system 224. The design of each of these components can be varied to suit the design requirements of the stage assembly 236.

In one embodiment, the stage mover 244 precisely moves the stage 240 and the device 242 relative to the stage base 238 and the reaction assembly 246. In some embodiments, the stage assembly 236 can further include a temperature controller (not illustrated) that controls the temperature of the stage mover 244 and/or the reaction assembly 246 under the direction of the control system 224.

The stage assembly 236 is particularly useful for precisely positioning the device 242 during a manufacturing and/or an inspection process. The type of device 242 positioned and moved by the stage assembly 236 can be varied. For example, the device 242 can be a semiconductor wafer, and the stage assembly 236 can be used as part of the exposure apparatus 10 for precisely positioning the semiconductor wafer during manufacturing of the semiconductor wafer. Alternatively, for example, the stage assembly 236 can be used to move other types of devices during manufacturing and/or inspection, to move a device under an electron microscope (not shown), or to move a device during a precision measurement operation (not shown).

The stage base 238 supports a portion of the stage assembly 236 above the mounting base 30 (illustrated in FIG. 1). In the embodiment illustrated herein, the stage base 238 is rigid and generally rectangular shaped.

As noted above, the stage 240 retains the device 242. Further, the stage 240 is precisely moved by the stage mover 244 to precisely position the device 242. In the embodiment illustrated herein, the stage 240 is generally rectangular shaped and includes a device holder (not shown) for retaining the device 242. The device holder can be a vacuum chuck, an electrostatic chuck, or some other type of clamp.

The stage 240 can be maintained spaced apart from (e.g., above) the reaction assembly 246 with the stage mover 244 if the stage mover 244 is a six degree of freedom mover that moves the stage 240 relative to the reaction assembly 246 with six degrees of freedom. In this embodiment, the stage mover 244 functions as a magnetic type bearing that levitates the stage 240. Alternatively, for example, the stage 240 can be supported relative to the reaction assembly 246 with a stage bearing (not shown), e.g., a vacuum preload type fluid bearing. For example, the bottom of the stage 240 can include a plurality of spaced apart fluid outlets (not shown), and a plurality of spaced apart fluid inlets (not shown). In this example, pressurized fluid (not shown) can be released from the fluid outlets towards the reaction assembly 246 and a vacuum can be pulled in the fluid inlets to create a vacuum preload type, fluid bearing between the stage 240 and the reaction assembly 246. In this embodiment, the stage bearing allows for motion of the stage 240 relative to the reaction assembly 246 along the X axis, along the Y axis and about the Z axis.

The stage mover 244 controls and adjusts the position of the stage 240 and the device 242 relative to the reaction assembly 246 and the stage base 238. For example, the stage mover 244 can be a planar motor that moves and positions the stage 240 along the X axis, along the Y axis and about the Z axis ("three degrees of freedom" or "the planar degrees of freedom"). Further, in certain embodiments, the stage mover 244 can also be controlled to move the stage 240 along Z axis and about the X and Y axes. With this design, the stage mover 244 is a six degree of freedom mover.

In the embodiment illustrated in FIG. 2, the stage mover 244 includes a conductor array 250, and an adjacent magnet array 252 that interacts with the conductor array 250. In FIG. 2, the conductor array 250 is coupled to the reaction assembly 246, and the magnet array 252 is secured to the stage 240 and is positioned above and adjacent to the conductor array 250. Alternatively, in another embodiment, the conductor array 250 can be coupled to the stage 240 and the magnet array 252 can be coupled to the reaction assembly 246. As provided herein, the array secured to the stage 240 can be referred to as the moving component (or mover) of the stage mover 244, and the array secured to the reaction assembly 246 can be referred to as the reaction component (or stator) of the stage mover 244.

In one embodiment, the conductor array 250 can include a plurality of coil units 254. The design and number of coil units 254 in the conductor array 250 can vary according to the performance and movement requirements of the stage mover 244. For example, in the embodiment illustrated in FIG. 2, the conductor array 250 includes one hundred eight coil units 254 that are arranged in a generally rectangular twelve-by-nine array.

Further, in this embodiment, each conductor unit 254 includes an upper, first coil set 254A that includes one or more first coils (not shown in FIG. 2), and a lower, second coil set 254B that includes one or more second coils (not shown in FIG. 2). In this embodiment, for each coil unit 254, the first coil set 254A is closer to the magnet array 252 than the second coil set 254B. As a result thereof, for each coil unit 254, the first coil set 254A is positioned in a stronger magnetic field and has a larger force constant than the corresponding second coil set 254B.

The first coil sets 254A collectively, can be referred to as an upper, first set (or layer) of conductors 256, and the second coil sets 254B collectively can be referred to as a lower, second set (or layer) of conductors 258. Thus, (i) the upper, first layer of conductors 256 is positioned closer to the magnet array 252 than the second layer of conductors 258 along the Z axis, (ii) the first layer of conductors 256 is positioned adjacent to the magnet array 252, (iii) the first layer of conductors 256 is positioned between the magnet array 252 and the second layer of conductors 258, and (iv) the first layer of conductors 256 is positioned in a stronger magnetic field and has a larger force constant than the second layer of conductors 258.

The magnet array 252 can include one or more magnets (not illustrated in FIG. 2) that interact with the plurality of coil units 254. The design of the magnet array 252 and the number of magnets in the magnet array 252 can be varied to suit the design requirements of the stage mover 244. For example, for a planar motor, the magnet array 252 includes a plurality of magnets. In some embodiments, each magnet can be made of a permanent magnetic material such as NdFeB.

The reaction assembly 246 counteracts, reduces and/or minimizes the influence of the reaction forces from the stage mover 244 on the position of the stage base 238 relative to the mounting base 30. This minimizes the distortion of the stage base 238 and improves the positioning performance of the stage assembly 236. Further, for an exposure apparatus 10, this allows for more accurate positioning of the semiconductor wafer.

As provided above, in the embodiment illustrated in FIG. 2, the conductor array 250 of the stage mover 244 is coupled to the reaction assembly 246. With this design, the reaction forces generated by the stage mover 244 are transferred to the reaction assembly 246. As a result thereof, when the stage mover 244 applies a force to move the stage 240, an equal and opposite reaction force is applied to the reaction assembly 246.

In FIG. 2, the reaction assembly 246 is a generally rectangular shaped and can be maintained above the stage base 238 with a reaction bearing (not shown), e.g. a vacuum preload type fluid bearing. For example, the bottom of the reaction assembly 246 can include a plurality of spaced apart fluid outlets (not shown), and a plurality of spaced apart fluid inlets (not shown). Pressurized fluid (not shown) can be released from the fluid outlets towards the stage base 238 and a vacuum can be pulled in the fluid inlets to create a vacuum preload type, fluid bearing between the stage base 238 and the reaction assembly 246. In this embodiment, the reaction bearing allows for motion of the reaction assembly 246 relative to the stage base 238 along the X axis, along the Y axis and about the Z axis. Alternatively, for example, the reaction bearing can be a magnetic type bearing, or a roller bearing type assembly.

With this design, through the principle of conservation of momentum, (i) movement of the stage 240 with the stage mover 244 along the X axis in a first X direction along the X axis, generates an equal but opposite X reaction force that moves the reaction assembly 246 in a second X direction that is opposite the first X direction along the X axis; (ii) movement of the stage 240 with the stage mover 244 along the Y axis in a first Y direction, generates an equal but opposite Y reaction force that moves the reaction assembly 246 in a second Y direction that is opposite the first Y direction along the Y axis; and (iii) rotation of the stage 240 with the stage mover 244 about the Z axis in a first theta Z direction, generates an equal but opposite theta Z reaction moment (torque) that rotates the reaction assembly 246 in a second theta Z direction that is opposite the first theta Z direction about the Z axis.

The design of the reaction assembly 246 can be varied to suit the design requirements of the stage assembly 236. In certain embodiments, the ratio of the mass of the reaction assembly 246 to the mass of the stage 240 is relatively high. This will minimize the movement of the reaction assembly 246 and minimize the required travel of the reaction assembly 246. A suitable ratio of the mass of the reaction assembly 246 to the mass of the stage 240 is between approximately 5:1 and 20:1. A larger mass ratio is better, but is limited by the physical size of the reaction assembly 246.

Additionally, a trim mover (not shown) can be used to adjust the position of the reaction assembly 246 relative to the stage base 238. For example, the trim mover can include one or more rotary motors, voice coil motors, linear motors, electromagnetic actuators, or other type of actuators.

In one embodiment, the control system 224 simultaneously and independently directs a first current to the first layer of conductors 256 and a second current to the second layer of conductors 258 to precisely position the device 242. Stated in another fashion, during each movement step, the control system 224 independently controls the currents flowing through the layers of conductors 256, 258, and as such, the planar motor 244 can be considered to be composed of two independently controlled motors. Electrical current (not shown) supplied to the coil units 254 interact with the magnetic field(s) of the one or more magnets in the magnet array 252. This causes a force (Lorentz type force) between the coil units 254 and the magnets that can be used to move the stage 240 relative to the stage base 238.

As provided herein, being closer to the magnet array 252, the top, first set of conductors 256 has a first force constant $K_f^T$ that is larger than a second force constant $K_f^B$ of the bottom, second set of conductors 258 because the first set of conductors 256 are exposed to a stronger magnetic field than the bottom set of conductors 258. Since the first current directed to the first set of conductors 256 and the second current directed to the second set of conductors 258 can be controlled independently with the control system 224, the present invention provides a method to determine what combination of current values will result in the minimum amount of power consumption (and heat dissipation), and minimum overall power losses for each movement of the stage 240.

In certain embodiments, the control system 24 directs more current to the first layer of conductors 256 than the second layer of conductors 258 during each respective movement step to reduce the power consumption. As used herein, $i^T$ represents the first current directed to the first layer of conductors 256, and $i^B$ represents the second current directed to the second layer of conductors 258. In alternative, non-exclusive embodiments, for a given movement step, the control system 24 directs at least approximately 1.03, 1.05, 1.1, 1.2, 1.5, 1.8, 2, or 3 times more current to the first layer of conductors 256 than the second layer of conductors 258. Stated in another fashion, in alternative, non-exclusive embodiments, the control system 24 directs the current so that the first current is at least approximately 3, 5, 10, 20, 50, 100, or 200 percent greater than the second current.

It should be noted that for any given movement step, for the embodiment illustrated in FIG. 2, in certain embodiments, current is only directed to the particular coil sets 254A, 254B (or the particular coil units 254) that are positioned in the magnetic fields of the magnet array 252. Thus, as the stage 240 is moved relative to the conductor array 250, the particular coil units 254 that are energized will vary.

The difference in current amplitude to the sets of conductors 256, 258 will vary according to the design of the stage mover 244. In certain embodiments, the difference between the current directed to the first layer of conductors 256 and the current directed to the second layer of conductors 258 by the control system 224 can be expressed as a current ratio ("CR"), and can be expressed as follows:

$$CR = \frac{i^T}{i^B}. \qquad \text{Equation (1)}$$

In alternative, non-exclusive embodiments, the current ratio is at least approximately 1.03, 1.05, 1.1, 1.2, 1.5, 1.8, 2, or 3. However, other values can be used.

As provided herein, to produce a certain, desired amount of force (F) on the stage 240, the two layers of conductors 256, 258 must work together as follows:

$$F = K_f^T i^T + K_f^B i^B. \qquad \text{Equation (2)}$$

The total power loss ("P") corresponding to a single coil unit 254 can be written as $$P = R^T i^{T2} + R^B i^{B2} \qquad \text{Equation (3),}$$

where $R^T$ is the resistance of the first coil set 254A, and $R^B$ is the resistance of the second coil set 254B.

Thus, for a given value of force (F), there are infinitely many combinations of $i^T$ and $i^B$ that would satisfy equation (2). As provided herein, there is a combination of the two current values that will result in the minimum amount of power consumption.

As a non-exclusive example, the stage assembly 236 can have the following design parameter values: (i) mass ("m") of the stage 240 of seventy-five kilograms, (m=75 Kg); (ii) resistance of the first coil set 254A and the second coil set 254B of four ohms ($R^T = R^B = 4.0$ Ohms); (iii) the first layer of conductors 256 have a force constant of twenty-five Newton per Ampere ($K_f^T = 25.0$ N/A); and (iv) the second layer of conductors 258 have a force constant of twelve and one half Newton per Ampere ($K_f^B = 12.5$ N/A). In this example, the situation where the force (F) is solely used to accelerate the stage 240 with the mass m is considered. Assuming in this simplified example that four coil units 254 are utilized at any given time, the force produced by a single coil unit is expressed as $F_s = (mg)/4$, where $F_s$ is the force for a single coil unit, and g is the acceleration of the stage 240.

As provided herein, there is a combination of the two currents $i^T$ and $i^B$ that will result in the minimum amount of power consumption. In one embodiment, to find the combination of currents that will result in the minimum, Equation (3) is minimized subject to Equation (2). This can be expressed as minimize $P = R^T i^{T2} + R^B i^{B2}$, subject to $F = K_f^T i^T + K_f^B i^B$.

The solution to the above minimization problem is given by $$i^B = \frac{F K_f^T R^B}{R^T K_f^{B2} + R^B K_f^{T2}} \qquad \text{Equation (4)}$$

and $$i^T = \frac{F - K_f^B i^B}{K_f^T}. \qquad \text{Equation (5)}$$

In other words, to produce a certain amount of force (F), using equations (4) and (5), the best combination of the currents to the layers of conductors 256, 258 ($i^T$ and $i^B$) is found so that the overall power consumption (from Equation (3)) is minimized. Solving for the ratio of the currents in the top layer and the bottom layer coils (Equation 5 over Equation 4, or $i^T/i^B$), the following equation provided the optimal current ratio which would result in the minimum power consumption:

$$CR = \frac{i^T}{i^B} = \frac{R^B K_f^T}{R^T K_f^B}. \qquad \text{Equation (6)}$$

Thus, the optimal current ratio is equal to the ratio of (i) the resistance of the second layer of conductors multiplied by the first force constant, and (ii) the resistance of the first layer of conductors multiplied by the second force constant.

For stage assemblies in which the resistance of the first coil set 254A is equal to the resistance of the second coil set 254B ($R^T = R^B$), Equation (6) can be reduced and rewritten as follows:

$$CR = \frac{i^T}{i^B} = \frac{K_f^T}{K_f^B}. \qquad \text{Equation (7)}$$

Using Equation (7), the optimum current ratio for the example provided above ((i) stage mass, m=75.0 Kg; (ii) $R^T = R^B = 4.0$ Ohms; (iii) $K_f^T = 25.0$ N/A; and (iv) $K_f^B = 12.5$ N/A is two (CR=2.0).

It should be noted that depending upon the design of the control system 224, in certain embodiments, there is a maximum amount of current that can be sent to each layer of conductors. This maximum amount of current can also be referred to as the saturation level.

As provided herein, the percent improvement due to the Power Minimizing Controller, as defined by Equations (4)-(7), compared to a control system that uses a current ratio of one (CR=1) can be determined using the following equation:

$$\% \text{ Improvement} = 100 \times \left(1 - \frac{P_{min}}{P_{eq}}\right) = \qquad \text{Equation (8)}$$

$$100 \times \left(1 - \frac{R^T R^B (K_f^T + K_f^B)^2}{(R^T + R^B)(R^T K_f^{B2} + R^B K_f^{T2})}\right).$$

In this equation, $P_{min}$ represents the resistive power loss associated when the stage mover is controlled to have improved performance (CR≠1) as provided by the present invention; and $P_{eq}$ represents the resistive power loss associated when the stage mover is controlled so that the same current is directed to all of the layers of conductors (CR=1).

In Equation 8, in the example where the top, first layer of conductors and the bottom, second layer of conductors are similar and have the same resistance values, i.e. $R^T = R^B$, Equation (8) can be rewritten as follows:

$$\% \text{ Improvement} = \qquad \text{Equation (9)}$$

$$100 \times \left(1 - \frac{P_{min}}{P_{eq}}\right) = 100 \times \left(1 - \frac{(K_f^T + K_f^B)^2}{2(K_f^{B2} + K_f^{T2})}\right).$$

Using the parameters of the stage assembly provided above, and substituting these parameter values into Equation (9), or Equation (8), the improvement percent is ten (as provided above), when the currents to the layers of conductors are below the saturation level.

In the case when the current to the top, first layer of conductors reaches saturation, (i.e. $i^T = i_{max}$) for the general case, the following equation can be used to calculate the amount of resistive power loss ($P_{min}$) associated with the power minimizing controller provided herein:

$$P_{min} = \left(\frac{R^B}{K_f^{B2}}\right)F^2 - \left(\frac{2R^B K_f^R i_{max}}{K_f^{B2}}\right)F + \left(\frac{R^T K_f^{B2} + R^B K_f^{T2}}{K_f^{B2}}\right)i_{max}^2. \quad \text{Equation (10)}$$

The power loss ($P_{eq}$) associated with the controller using a unity current ratio (CR=1), on the other hand, can be calculated by the following equation:

$$P_{eq} = (R^T + R^B) i_{max}^2. \quad \text{Equation (11)}$$

When both the first current to the top, first layer of conductors and the second current to the bottom, second layer of conductors reach the saturation level, equations (10) and (11) will result in the same amount of power consumption ($P_{min} = P_{eq}$).

As provided herein, some of the equations can be further simplified using one or more dimensionless parameters. For example, a non-dimensional ratio of the force constants and a non-dimensional ratio of the resistance values can be used. As a non-exclusive example, the non-dimensional ratio of the force constants, and the non-dimensional ratio of the resistance values can be defined as follows:

$$\alpha = \frac{K_f^T}{K_f^B} \quad \text{Equation (12)}$$

$$\beta = \frac{R^T}{R^B}. \quad \text{Equation (13)}$$

In Equation 12, $\alpha$ is the non-dimensional ratio of the force constants. Similarly, in Equation 12, $\beta$ is the non-dimensional ratio of the resistance values.

Using Equations 12 and 13, Equation (6) for the optimum current ratio can be reduced to the following $$\frac{i^T}{i^B} = \frac{\alpha}{\beta}. \quad \text{Equation (14)}$$

Somewhat similarly, Equation (8) can be rewritten as follows:

$$\% \text{ Improvement} = 100 \times \left(1 - \frac{P_{min}}{P_{eq}}\right) = 100 \times \left(1 - \frac{\beta(1+\alpha)^2}{(1+\beta)(\beta+\alpha^2)}\right). \quad \text{Equation (15)}$$

Further, for the example where the top, first layer of conductors and the bottom, second layer of conductors are similar and have the same resistance values, i.e. $R^T = R^B$, then the non-dimensional ratio of the resistance values is equal to one ($\beta = 1$), and Equation (15) can be reduced as follows:

$$\% \text{ Improvement} = 100 \times \left(1 - \frac{P_{min}}{P_{eq}}\right) = 100 \times \left(1 - \frac{(1+\alpha)^2}{2(1+\alpha^2)}\right). \quad \text{Equation (16)}$$

Using these Equations, for a simplified stage assembly having the characteristics of (i) a stage mass, m=75.0 Kg; (ii) $R^T = R^B = 4.0$ Ohms; (iii) $K_f^T = 25.0$ N/A; and (iv) $K_f^B = 12.5$ N/A), the optimum current ratio is two (CR=2), and the percent improvement is ten (% improvement=10).

FIGS. 3-8 are alternative graphs that illustrate the improvement in the performance for the stage assembly. The graphs in FIGS. 3-8 were generated using the stage assembly parameters provided in the previous paragraph.

Figure 3:
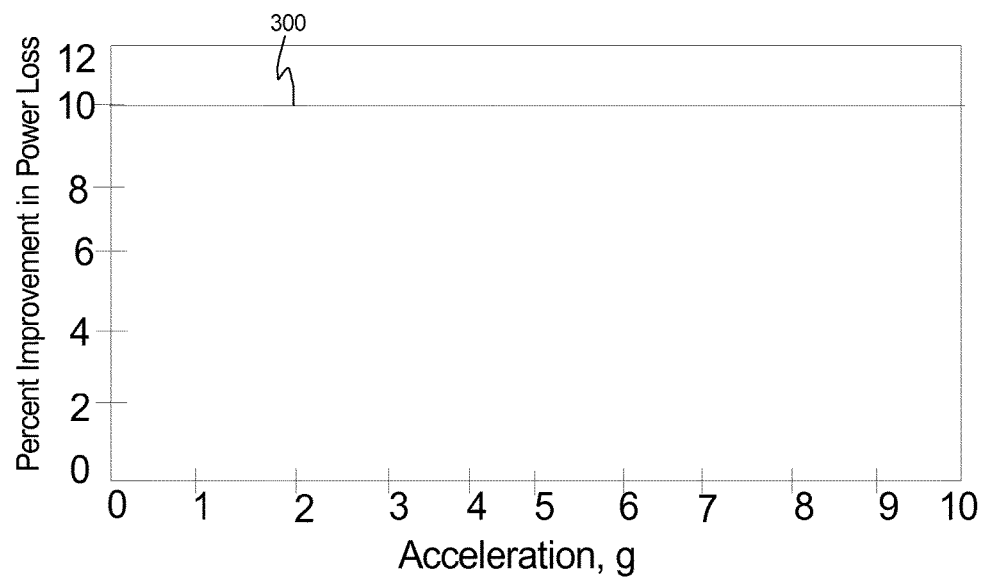
FIG. 3 is a graph that plots percent improvement in power loss versus acceleration for a stage assembly controlled pursuant to the present invention.
Figure 4:
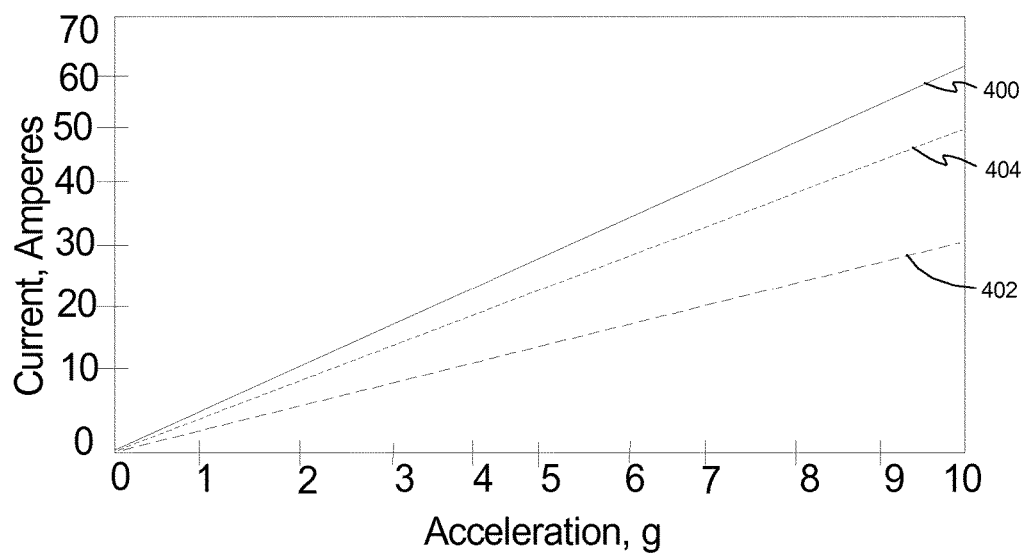
FIG. 4 is a graph that plots current versus acceleration for a stage assembly controlled pursuant to the present invention.

More specifically, FIGS. 3 and 4 are graphs that show the results for the case when there is no saturation limit for the currents ($i^T$ and $i^B$) to the layers of conductors 256, 258. Stated in another fashion, in this example, unlimited current can be directed to the layers of conductors 256, 258. FIG. 3 is a graph that includes a line 300 that plots percent improvement in power loss versus acceleration and illustrates that the percent improvement in the total power loss with no saturation limit for the currents is ten percent (10%) by adopting the optimized current ratio, when compared to the controller which uses a current ratio of one (CR=1). FIG. 4 is the corresponding graph that includes (i) a solid line 400 that plots current versus acceleration for the first layer of conductors with the optimized current ratio, (ii) a long dashed line 402 that plots current versus acceleration for the second layer of conductors with the optimized current ratio; and (ii) a short dashed line 404 that plots current versus acceleration for the two layers of conductors when the current ratio is equal to one (equal current is directed to each of the two layers of conductors). As illustrated in FIG. 4, for the optimized current ratio, and because there is no saturation limit in this example, more current is always directed to the first layer of conductors than to the second layer of conductors (compare line 400 to 402) to reach the desired acceleration. Further, for the non-optimized design, with the current ratio equal to one, the same current is directed to both layers of the conductors (line 404) to reach the desired acceleration.

Figure 5:
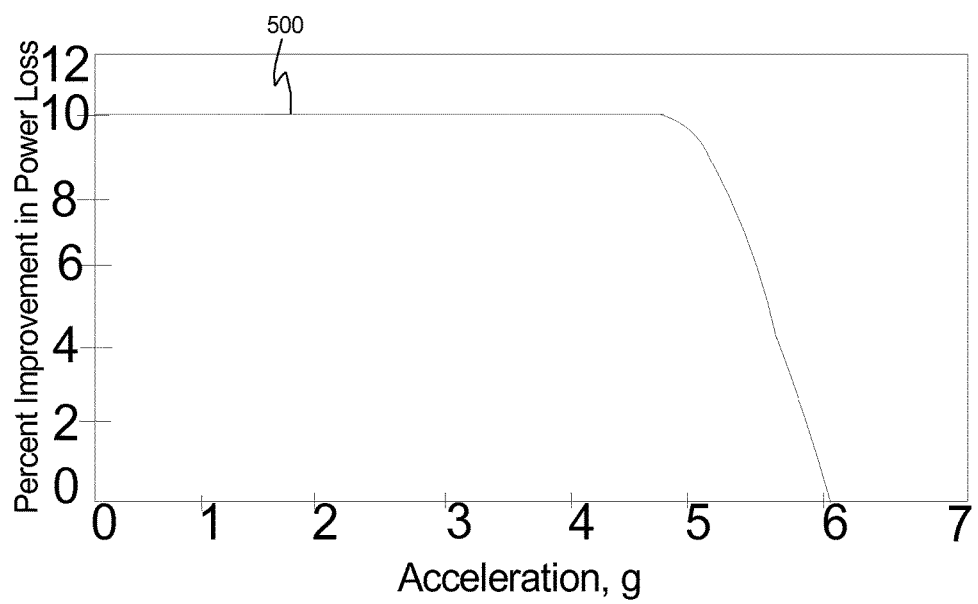
FIG. 5 is another graph that plots percent improvement in power loss versus acceleration for a stage assembly controlled pursuant to the present invention.
Figure 6:
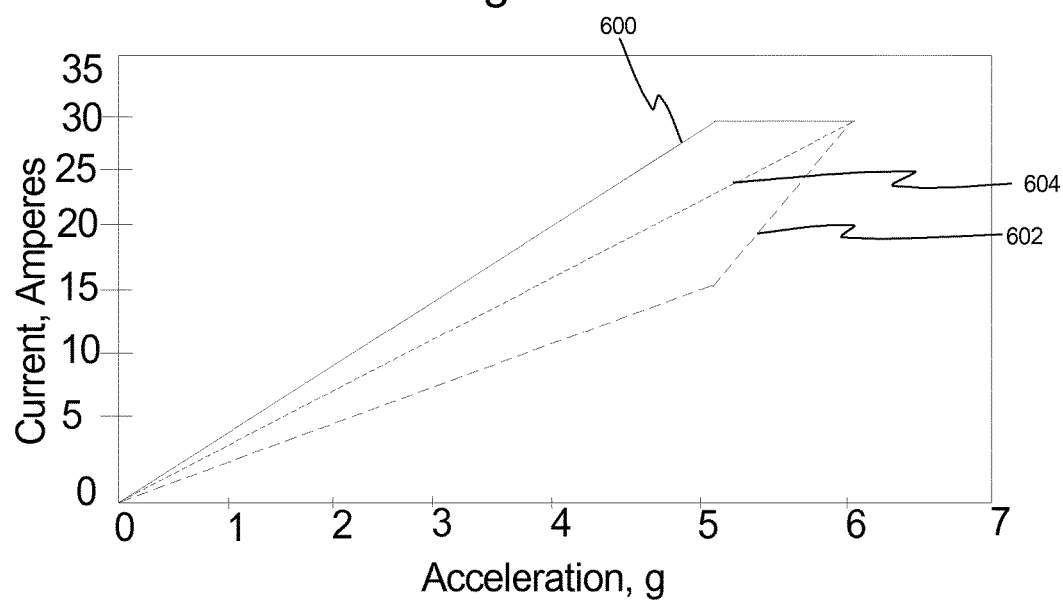
FIG. 6 is another graph that plots current versus acceleration for a stage assembly controlled pursuant to the present invention.

FIGS. 5 and 6 are graphs that show the results for the case when there is a saturation limit of thirty amperes (30 Amps) for the currents ($i^T$ and $i^B$) to the layers of conductors 256, 258. Stated in another fashion, in this example, the maximum amount of current that can be directed to each of the layers of conductors 256, 258 is thirty amperes. FIG. 5 is a graph that includes a line 500 that plots percent improvement in power loss versus acceleration and illustrates that the percent improvement in the total power loss is ten percent (10%) when compared to the controller which uses a current ratio of one (CR=1), until the current to the first layer of conductors reach the saturation point of thirty amperes. Subsequently, the percent improvement in the total power loss decreases from ten percent to zero at the point where both layers of conductors reach the saturation point.

FIG. 6 is the corresponding graph that includes (i) a solid line 600 that plots current versus acceleration for the first layer of conductors with the optimized current ratio, (ii) a long dashed line 602 that plots current versus acceleration for the second layer of conductors with the optimized current ratio; and (ii) a short dashed line 604 that plots current versus acceleration for the two layers of conductors when the current ratio is equal to one (equal current is directed to each of the two layers of conductors). As illustrated in FIG. 6, for the optimized current ratio, and because there is a saturation limit of thirty amperes in this example, more current is directed to the first layer of conductors than to the second layer of conductors (compare line 600 to 602) until the saturation limit is reached by both layers of conductors to reach the desired acceleration. Further, for the non-optimized design, with the current ratio equal to one, the same current is directed to both layers of the conductors (line 604) to reach the desired acceleration.

Figure 7:
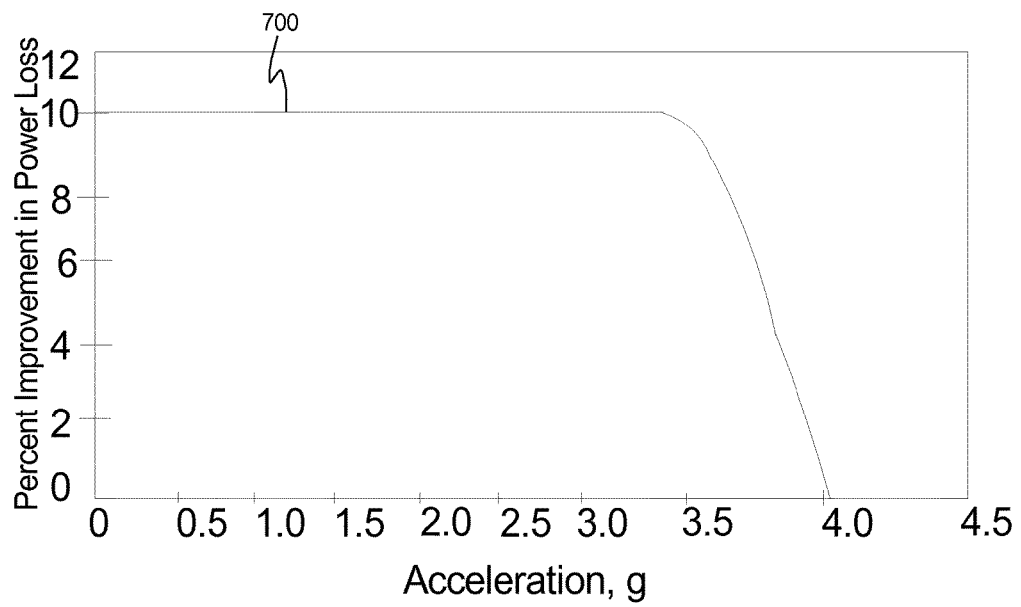
FIG. 7 is yet another graph that plots percent improvement in power loss versus acceleration for a stage assembly controlled pursuant to the present invention.
Figure 8:
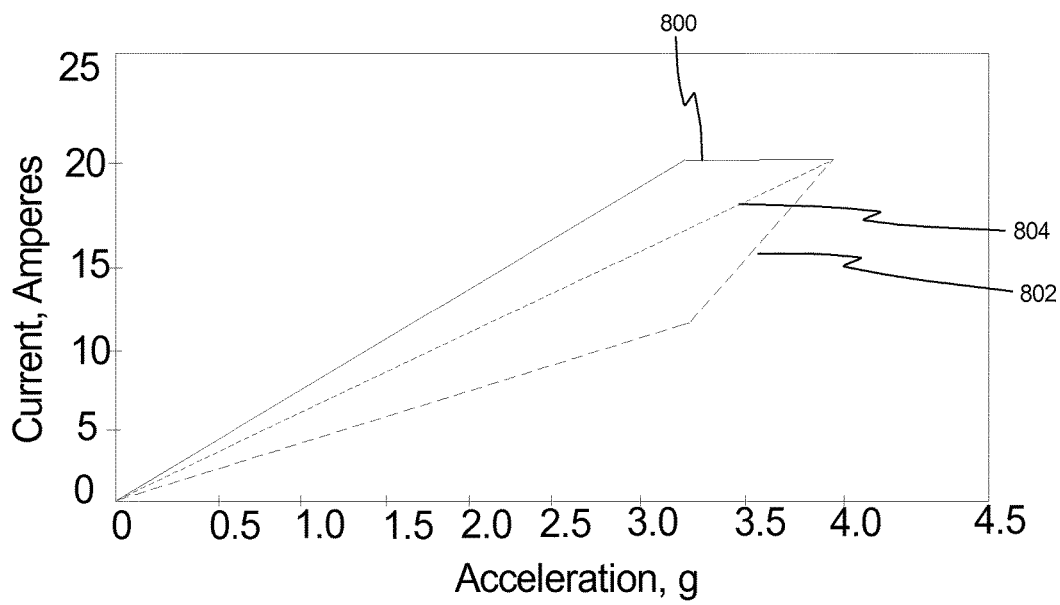
FIG. 8 is yet another graph that plots current versus acceleration for a stage assembly controlled pursuant to the present invention.

Somewhat similarly, FIGS. 7 and 8 are graphs that show the results for the case when there is a saturation limit of twenty amperes (20 Amps) for the currents ($i^T$ and $i^B$) to the layers of conductors 256, 258. Stated in another fashion, in this example, the maximum amount of current that can be directed to each of the layers of conductors 256, 258 is twenty amperes. FIG. 7 is a graph that includes a line 700 that plots percent improvement in power loss versus acceleration and illustrates that the percent improvement in the total power loss is ten percent (10%) when compared to the controller which uses a current ratio of one (CR=1), until the current to the first layer of conductors reach the saturation point of twenty amperes. Subsequently, the percent improvement in the total power loss decreases from ten percent to zero at the point where both layers of conductors reach the saturation point.

FIG. 8 is the corresponding graph that includes (i) a solid line 800 that plots current versus acceleration for the first layer of conductors with the optimized current ratio, (ii) a long dashed line 802 that plots current versus acceleration for the second layer of conductors with the optimized current ratio; and (ii) a short dashed line 804 that plots current versus acceleration for the two layers of conductors when the current ratio is equal to one (equal current is directed to each of the two layers of conductors). As illustrated in FIG. 8, for the optimized current ratio, and because there is a saturation limit of twenty amperes in this example, more current is directed to the first layer of conductors than to the second layer of conductors (compare line 800 to 802) until the saturation limit is reached by both layers of conductors to reach the desired acceleration. Further, for the non-optimized design, with the current ratio equal to one, the same current is directed to both layers of the conductors (line 804) to reach the desired acceleration.

It should be noted in these graphs that as the current in the upper, top layer of conductors reaches saturation, the advantage of using the power minimizing controller disclosed herein diminishes. Further, in the examples provided herein, when the currents are below the saturation level, an improvement in the total power consumption of approximately 10% can be achieved by utilizing the power minimizing controller provided herein, when compared to the case when the current ratio is one.

Figure 9A:
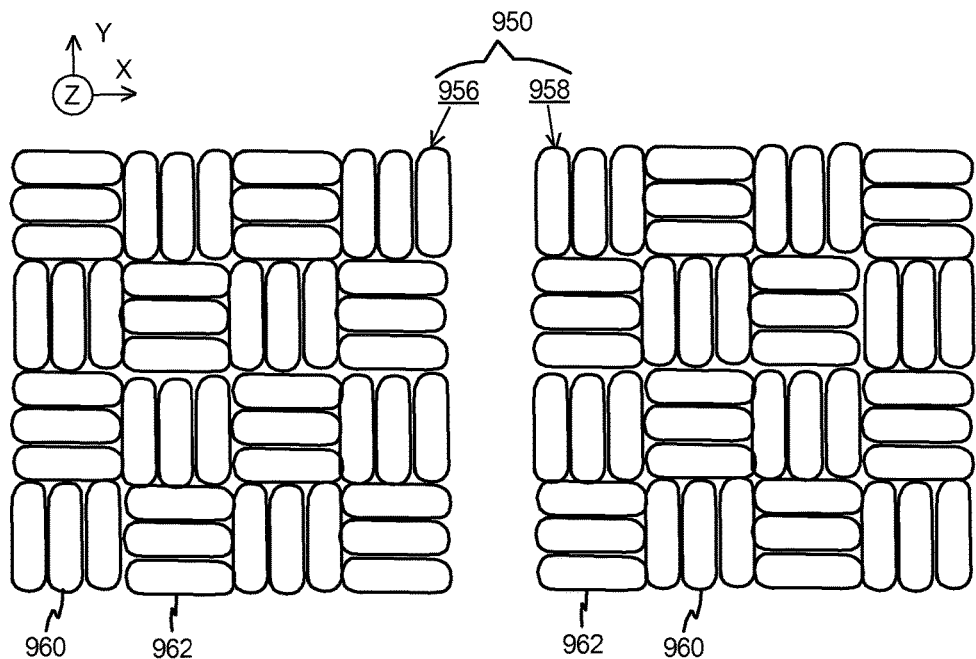
FIG. 9A is top plan view of a first embodiment of a first layer of conductors and a second layer of conductors having features of the present invention.

FIG. 9A is simplified, top plan view of a first embodiment of a first layer of conductors 956 and a second layer of conductors 958 of a conductor array 950. It should be noted that in FIG. 9A, the layers of conductors 956, 958 are positioned side by side for clarity. In usage, the first layer of conductors 956 is stacked and positioned on top of the second layer of conductors 958 along the Z axis.

In this embodiment, the first layer of conductors 956 includes a plurality of X axis coil sets 960 and a plurality of Y axis coil sets 962 that are arranged in an alternating fashion along the X axis and along the Y axis. Stated in another fashion, the X axis coil sets 960 are alternatively interspersed with the Y axis coil sets 962 along the X axis and along the Y axis to create a checkerboard pattern. Stated in yet another fashion, the first layer of conductors 956 illustrated in FIG. 9A is organized as a square grid that includes four rows (aligned with the X axis), and four columns (aligned with the Y axis). Further, (i) in each row, the X axis coil sets 960 are alternatively interspersed with the Y axis coil sets 962; and (ii) in each column, the X axis coil sets 960 are alternatively interspersed with the Y axis coil sets 962. Further, in certain embodiments, all of the coil sets 960, 962 in the first layer of conductors 956 are in substantially the same plane and have the same Z axis position.

Similarly, in this embodiment, the second layer of conductors 958 includes a plurality of X axis coil sets 960 and a plurality of Y axis coil sets 962 that are arranged in an alternating fashion along the X axis and along the Y axis. Stated in another fashion, the X axis coil sets 960 are alternatively interspersed with the Y axis coil sets 962 along the X axis and along the Y axis to create a checkerboard pattern. Further, in certain embodiments, all of the coil sets 960, 962 in the second layer of conductors 958 are in substantially the same plane and have the same Z axis position.

It should be noted that either of the axis coil sets 960, 962 can be referred as a first axis coil set or a second axis coil set.

Additionally, it should be noted that the number of coils sets 960, 962 in each layer of conductors 956, 958 can be varied according to the movement requirements of the stage assembly 236 (illustrated in FIG. 2). In the simplified example in FIG. 9A, each layer of conductors 956, 958 includes sixteen coil sets 960, 962. Alternatively, the conductor array 950 can be designed to include more than sixteen or fewer than sixteen coil sets 956, 958.

With the design illustrated in FIG. 9A, in certain embodiments, the control system 224 (illustrated in FIG. 2) can direct (i) current to certain X axis coil sets 960 to create an interaction with the magnetic field(s) of the magnet array 252 (illustrated in FIG. 2) to generate one or more X axis forces (not shown) along the X axis that are imparted on the stage 240 (illustrated in FIG. 2), and (ii) current to certain Y axis coil sets 962 to create an interaction with the magnetic field(s) of the magnet array 252 to generate one or more Y axis forces (not shown) along the Y axis that are imparted on the stage 240. Further, in certain embodiments, the control system 224 can directed (i) current to certain X axis coil sets 960 to create an interaction with the magnetic field(s) of the magnet array 252 to generate one or more Z axis forces (not shown) along the Z axis that are imparted on the stage 240, and/or (ii) current to certain Y axis coil sets 962 to create an interaction with the magnetic field(s) of the magnet array 252 to also generate one or more Z axis forces. With this design, the X axis coil sets 960 are used to generate forces along the X and Z axes, and the Y axis coil sets 962 are used to generate forces along the Y and Z axes. Further, in certain embodiments, multiple forces can be generated along each axis. These forces can be controlled to generate controllable forces about the X, Y, and Z axes.

It should also be noted that when the first layer of conductors 956 is stacked and positioned on top of the second layer of conductors 958, the conductor array 950 of FIG. 9A defines sixteen separate coil units (not shown in FIG. 9A) with each coil unit including one X axis coil set 960 and one Y axis coil set 962. Further, these coil units can include (i) eight XY coil units, and (ii) eight YX coil units. In the XY coil units, the X axis coil set 960 (from the first layer of conductors 956) is on top of the Y axis coil set 962 (from the second layer of conductors 958). Further, in the YX coil units, the Y axis coil set 962 (from the first layer of conductors 956) is on top of the X axis coil set 960 (from the second layer of conductors 958). Further, the XY coil units and the YX coil units are arranged in an alternating fashion along the X axis and along the Y axis.

Figure 9B:
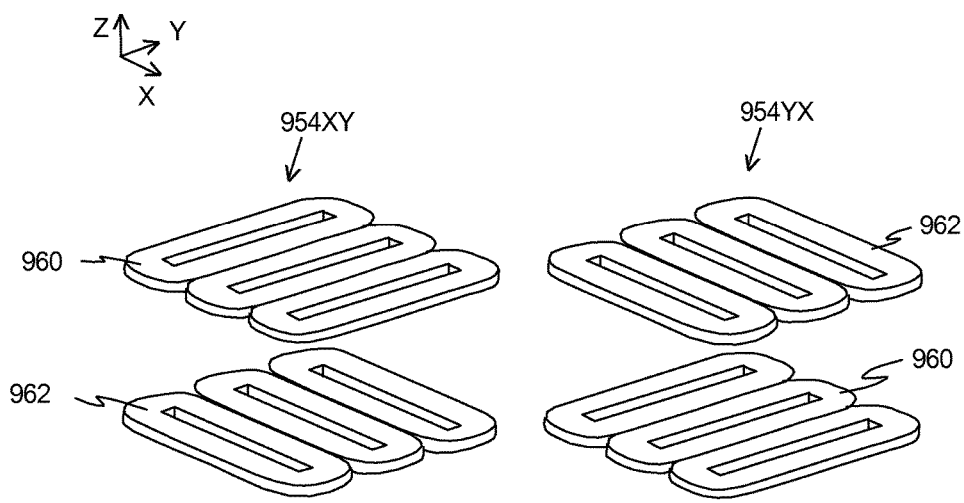
FIG. 9B is an exploded perspective view of a first embodiment of a first coil unit and a second coil unit.

FIG. 9B is an exploded perspective view of an XY coil unit 954XY and a YX coil unit 954YX from the conductor array 950 of FIG. 9A. In FIG. 9B, (i) for the XY coil unit 954XY, the X axis coil set 960 is positioned on top of the Y axis coil set 962; and (ii) for the YX coil unit 954YX, the Y axis coil set 962 is on top of the X axis coil set 960.

The design of each coil set 960, 962 can be varied. In FIG. 9B, each coil set 960, 962 includes three separate coils. Alternatively, each coil set 960, 962 can include more than three or fewer than three coils. Each coil can be a conductor that is made of a metal such as copper or any substance or material responsive to electrical current and capable of creating a magnetic field such as superconductors.

Figure 10A:
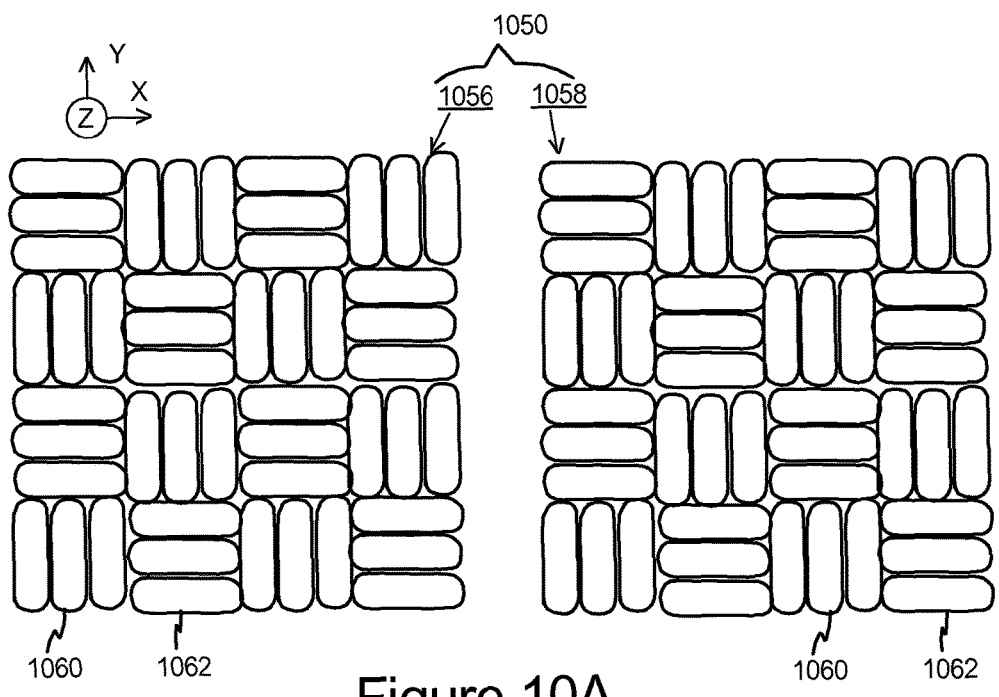
FIG. 10A is top plan view of another embodiment of a first layer of conductors and a second layer of conductors having features of the present invention.

FIG. 10A is simplified, top plan view of another embodiment of a first layer of conductors 1056 and a second layer of conductors 1058 of a conductor array 1050. It should be noted that in FIG. 10A, the layers of conductors 1056, 1058 are positioned side by side for clarity. In usage, the first layer of conductors 1056 is stacked and positioned on top of the second layer of conductors 1058 along the Z axis.

Similar to the embodiment illustrated in FIG. 9A, (i) the first layer of conductors 1056 includes a plurality of X axis coil sets 1060 and a plurality of Y axis coil sets 1062 that are arranged in an alternating fashion along the X axis and along the Y axis; (ii) the second layer of conductors 1058 includes a plurality of X axis coil sets 1060 and a plurality of Y axis coil sets 1062 that are arranged in an alternating fashion along the X axis and along the Y axis; and (iii) when the first layer of conductors 1056 is stacked and positioned on top of the second layer of conductors 1058, the conductor array 1050 of FIG. 10A defines sixteen separate coil units (not shown in FIG. 10A).

However, in the embodiment illustrated in FIG. 10A, each coil unit includes either two X axis coil sets 960 or two Y axis coil sets 962. Stated in another fashion, the conductor array 1050 defines (i) eight X coil units, and (ii) eight Y coil units. In the X coil units, one X axis coil set 960 from the first layer of conductors 956) is on top of one X axis coil set 960 from the second layer of conductors 958. Further, in the Y coil units, one Y axis coil set 962 from the first layer of conductors 956 is on top of one Y axis coil set 962 from the second layer of conductors 958. Further, the X coil units and the Y coil units are arranged in an alternating fashion along the X axis and along the Y axis.

Figure 10B:
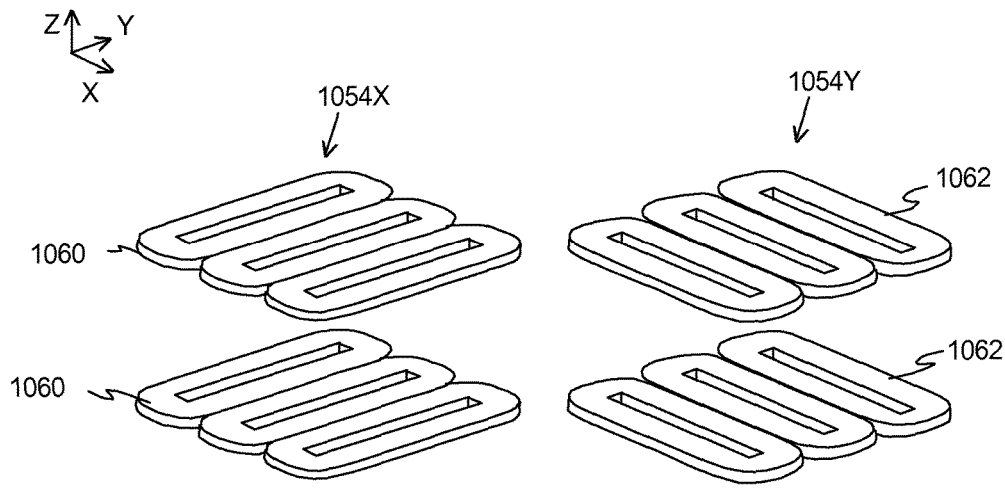
FIG. 10B is an exploded perspective view of another embodiment of a first coil unit and a second coil unit.

FIG. 10B is an exploded perspective view of an X coil unit 1054X and a Y coil unit 1054Y from the conductor array 1050 of FIG. 10A. In FIG. 10B, (i) for the X coil unit 1054X, the two X axis coil sets 1060 are stacked along the Z axis; and (ii) for the Y coil unit 1054Y, the two Y axis coil sets 1062 are stacked along the Z axis.

Figure 11:
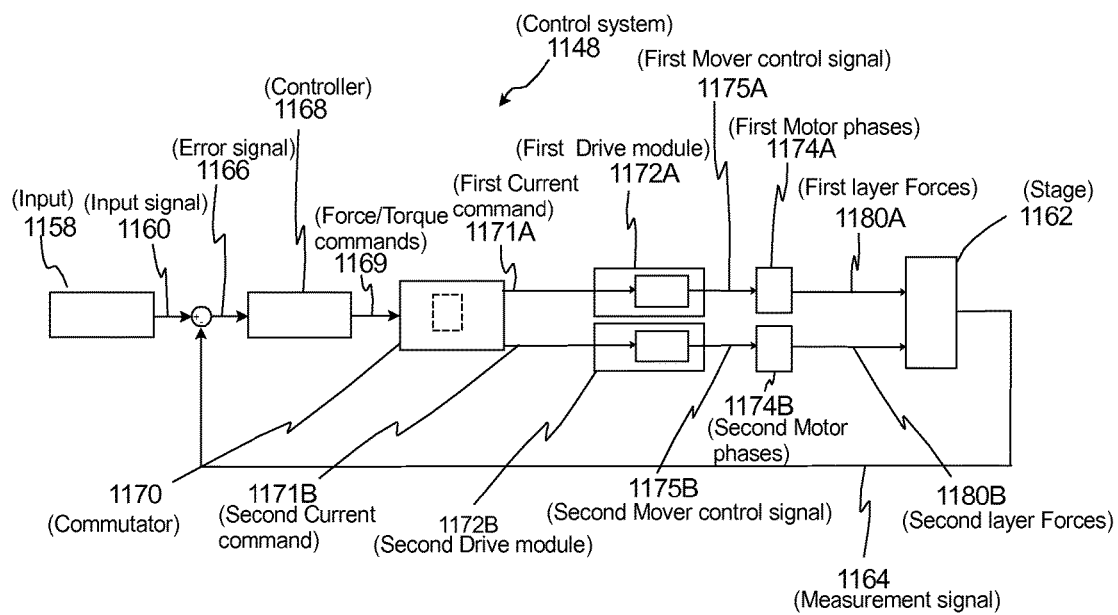
FIG. 11 is a schematic illustration of a control system having features of the present invention.

FIG. 11 is a control diagram that illustrates one embodiment of a control system 1148 having features of the present invention. In this embodiment, moving left to right, the input block 1158 provides an input signal 1160, e.g., a position reference or trajectory control signal that indicates a desired trajectory for a stage 1162. Next, the control system 1148 receives a measurement signal 1164, provided by the measurement system (illustrated in FIG. 1) that indicates a present measured position of the stage 1162. The control system 1148 can use the measurement signals 1164 to determine the current position and velocity of the stage 1162.

As further shown in FIG. 11, the input signal 1160, e.g., the desired trajectory, is combined with the measurement signal 1164 to form an error signal 1166 that represents the difference between the measured position and the desired position. The error signal 1166 is subsequently input to a controller 1168, which, in turn, generates a force command and a torque command (indicated by single line 1169) for moving the stage 1162 as desired. Stated in another manner, the control system 1148 via the controller 1168 generates the force command and the torque command based on the determined position and velocity information of the stage 1162, along with the desired trajectory of the stage 1162.

In certain embodiments, as shown, the force command and the torque command 1169 are sent to a commutator 1170, which uses the previously determined current ratio for that stage mover (e.g. CR=2 for the example provided above) to generate a first current command signal 1171A for the upper, first layer of conductors, and a second current command signal 1171B for the lower, second layer of conductors of the stage mover.

The first current command signals 1171A generated by the commutator 1170 are sent to a first drive module 1172A or amplifier for driving the phases 1174A (illustrated as a single phases) of the upper, first layer of conductors. The drive module 1172A then generates a first mover control signal 1175A for driving each phase 1174A of the upper, first layer of conductors to generate first layer forces 1180A that are applied to the stage 1162.

Similarly, the second current command signals 1171B generated by the commutator 1170 are sent to a second drive module 1172B or amplifier for driving the phases 1174B (illustrated as a single phases) of the lower, second layer of conductors. The drive module 1172B then generates a second mover control signal 1175B for driving each phase 1174B of the lower, second layer of conductors to generate second layer forces 1180B that are applied to the stage 1162.

Thus, in this embodiment, the first layer of conductors and the second layer of conductors function as two independently controlled motors, and the current flowing to each layer of conductors is independently controlled.

Figure 12:
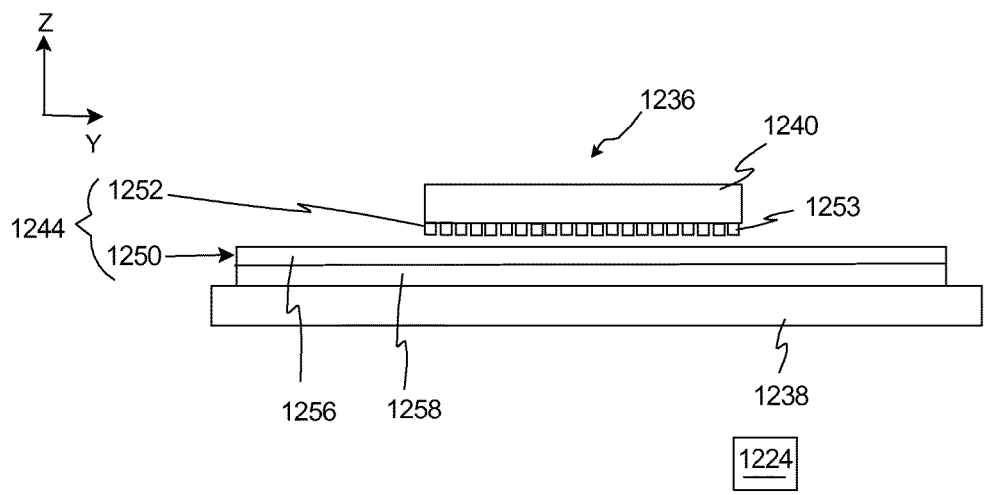
FIG. 12 is a simplified side view of a mover assembly having features of the present invention.

It should be noted that the present invention can be applied to other types of motors that use at least two redundant coils that are configured with a different force constant or resistance. For example, FIG. 12 is a simplified illustration of a portion of another embodiment of a control system 1224, and a stage assembly 1236 that includes a stage mover 1244 that moves a stage 1240 relative to a stage base 1238 primarily along an axis (e.g. the Y axis is this example). In this embodiment, the stage mover 1244 is a linear motor that includes a magnet array 1252, and a conductor array 1250.

In this embodiment, the magnet array 1252 includes a plurality of magnets 1253 that are aligned in a one dimensional array. Further, the conductor array 1250 includes an upper, first layer of conductors 1256 that are closer to the magnet array 1252, and a lower, second layer of conductors 1258 that is farther away from the magnet array 1252. In this design, the control system 1224 directs more current to the first layer of conductors 1256 than the second layer of conductors 1258.

Alternatively, for example, the present invention can be used in another type of mover, such as a voice coil motor.

Figure 13:
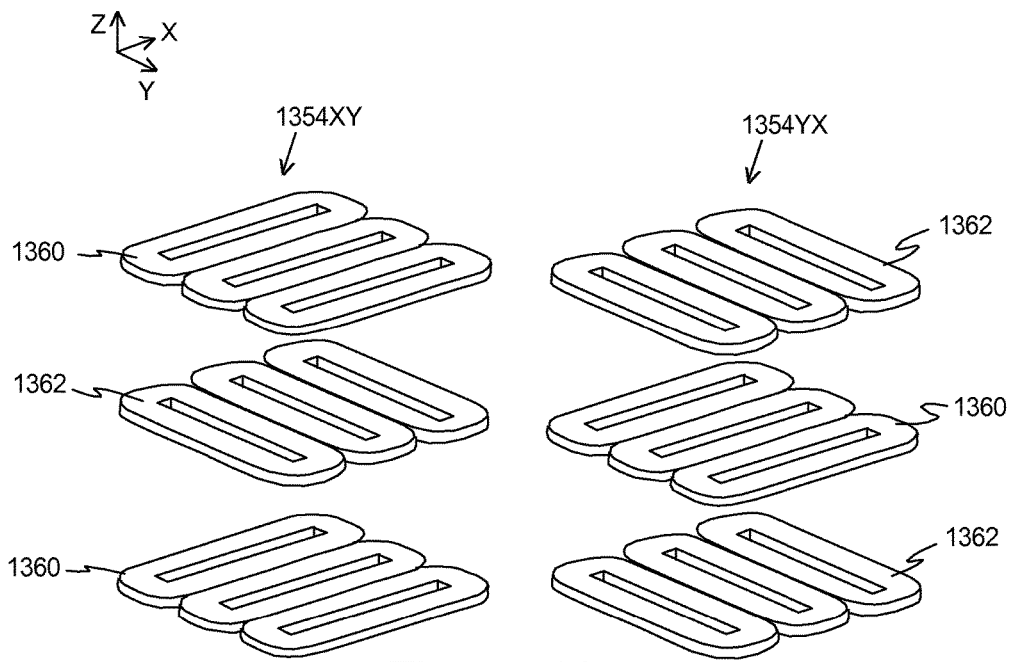
FIG. 13 is an exploded perspective view of yet another embodiment of a first coil unit and a second coil unit.

Additionally, it should be noted that the present invention is also useful for conductor arrays that include more than two layers of conductors. For example, FIG. 13 is an exploded perspective view of another embodiment of an XY coil unit 1354XY and a YX coil unit 1354YX that can be used in a conductor array. In FIG. 13, (i) the XY coil unit 1354XY includes two X axis coil sets 1360 that are positioned on the top and the bottom of one Y axis coil set 1362 along the Z axis; and (ii) the YX coil unit 1354YX includes two Y axis coil sets 1362 that are positioned on the top and the bottom of one X axis coil set 1360 along the Z axis. With this design, the conductor array includes a first layer of conductors that is closest to the magnet array (not shown), a second layer of conductors that is next closest to the magnet array, and a third layer of conductors that is farthest from the magnet array. Further, for a given movement step, the control system (i) will direct more current to the first layer of conductors than the second layer of conductors, and (ii) will direct more current to the second layer of conductors than the third layer of conductors.

It should be noted that this design could be modified to include more than three layers of conductors.

Figure 14:
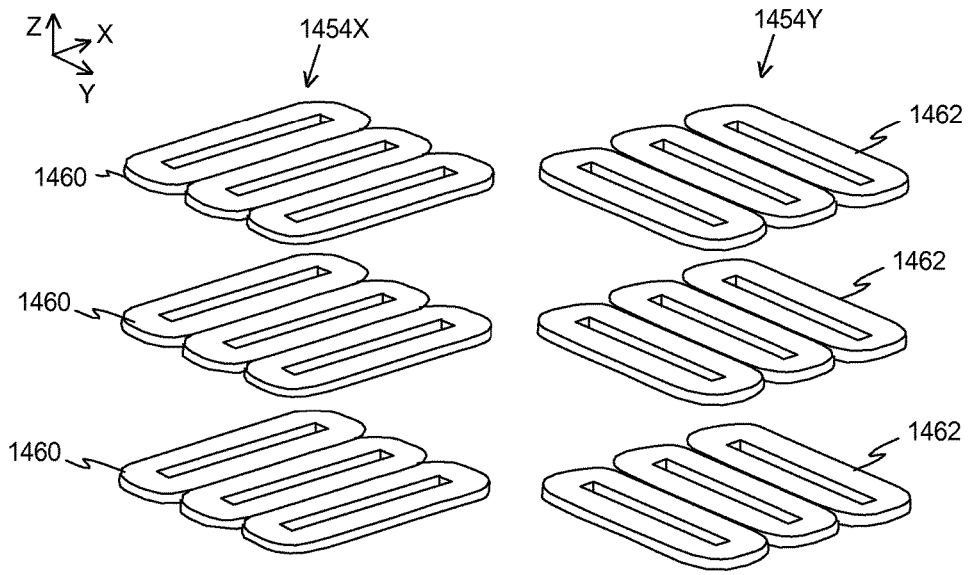
FIG. 14 is an exploded perspective view of still another embodiment of a first coil unit and a second coil unit.

Somewhat similarly, FIG. 14 is an exploded perspective view of another embodiment of a X coil unit 1454X and a Y coil unit 1454Y that can be used in a conductor array. In FIG. 14, (i) the X coil unit 1454X includes three X axis coil sets 1460 that are stacked and aligned along the Z axis; and (ii) the Y coil unit 1454Y includes three Y axis coil sets 1462 that are stacked and aligned along the Z axis. With this design, the conductor array includes a first layer of conductors that is closest to the magnet array (not shown), a second layer of conductors that is next closest to the magnet array, and a third layer of conductors that is farthest from the conductor array. Further, for a given movement step, the control system (i) will direct more current to the first layer of conductors than the second layer of conductors, and (ii) will direct more current to the second layer of conductors than the third layer of conductors.

Figure 15A:
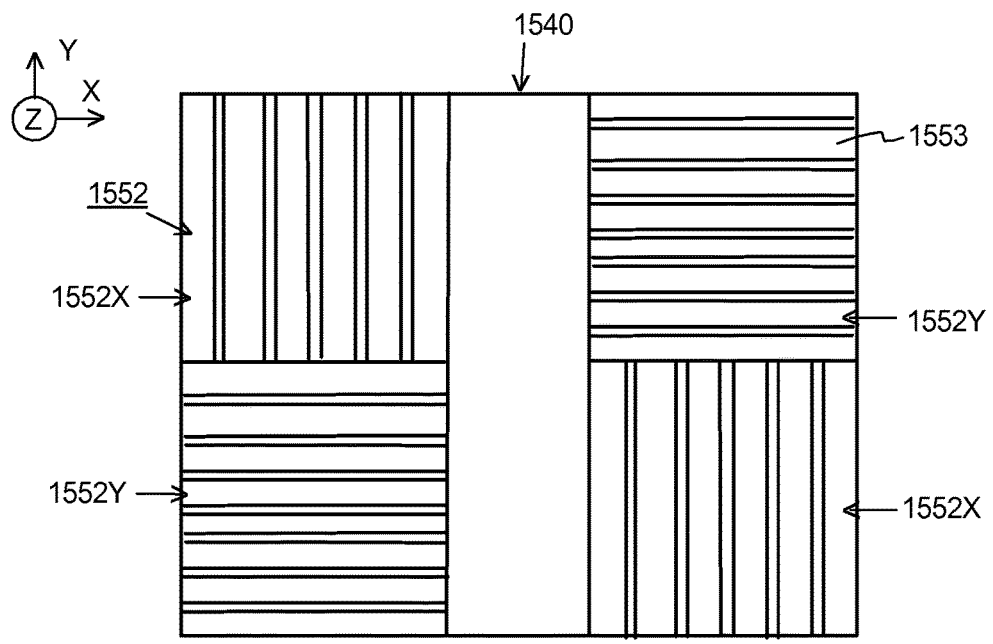
FIG. 15A is a simplified plan view of a magnet array having features of the present invention.

FIG. 15A is a simplified bottom plan view of a stage 1540 and a magnet array 1552 that can be used with any of the conductor arrays (not shown in FIG. 15A) disclosed herein. In this, non-exclusive embodiment, the magnet array 1552 includes (i) two, spaced apart, X magnet sets 1552X, and (ii) two, spaced apart, Y magnet sets 1552Y that are secured to the bottom of the stage 1540. In this embodiment, (i) each of the X magnet sets 1552X interacts with fields generated by current in the X axis coil sets (not shown in FIG. 15A) to generate a separate X axis force; and (ii) each of the Y magnet sets 1552Y interacts with fields generated by current in the Y axis coil sets (not shown in FIG. 15A) to generate a separate Y axis force. Further, each of the X magnet sets 1552X includes a plurality of magnets 1553 that are spaced apart along the X axis, and each of the Y magnet sets 1552Y includes a plurality of magnets 1553 that are spaced apart along the Y axis.

Figure 15B:
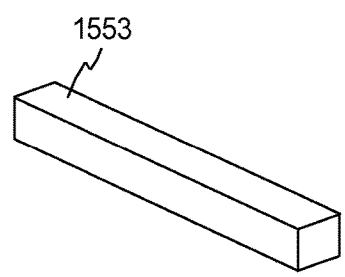
FIG. 15B is a simplified perspective view of a magnet having features of the present invention

FIG. 15B is a simplified perspective view of a magnet 1553 that can be used in the magnet array 1540 of FIG. 15A. In this embodiment, the magnet 1553 is a long, generally rectangular shaped.

Figure 16:
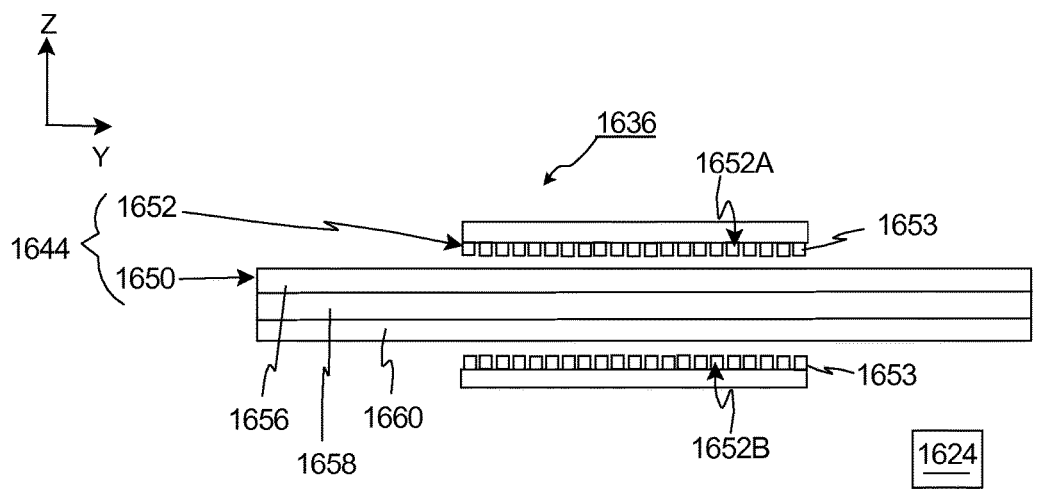
FIG. 16 is a simplified side view of another embodiment of a mover assembly having features of the present invention.

FIG. 16 is a simplified illustration of a portion of yet another embodiment of a control system 1624, and a stage assembly 1636 that includes a stage mover 1644. In this embodiment, the stage mover 1644 is a linear motor that includes a magnet array 1652, and a conductor array 1650.

Moreover, in this embodiment, the magnet array 1652 includes (i) a first magnet group 1652A that includes a plurality of magnets 1653 that are aligned in a one dimensional array; and (ii) a second magnet group 1652B that is spaced apart from the first magnet group 1652A and that includes a plurality of magnets 1653 that are aligned in a one dimensional array.

Further, the conductor array 1650 includes (i) an upper, first layer of conductors 1656, (ii) a middle, second layer of conductors 1658, and (iii) a lower, third layer of conductors 1660. In this embodiment, (i) the first layer of conductors 1656 is closer to the first magnet group 1652A than the second layer of conductors 1658, (ii) the second layer of conductors 1658 is closer to the first magnet group 1652A than the third layer of conductors 1660, (iii) the third layer of conductors 1660 is closer to the second magnet group 1652B than the second layer of conductors 1658, and (iv) the second layer of conductors 1658 is closer to the second magnet group 1652B than the first layer of conductors 1656. In this embodiment, the control system 1624 directs a first current to the first layer of conductors 1656, a second current to the second layer of conductors 1658, and a third current to the third layer of conductors 1660. In certain embodiments, the first current and the third current are greater than the second current during the movement step to reduce the power consumption. Further, in certain embodiments, the first current is equal to the third current during a movement step.

Figure 17:
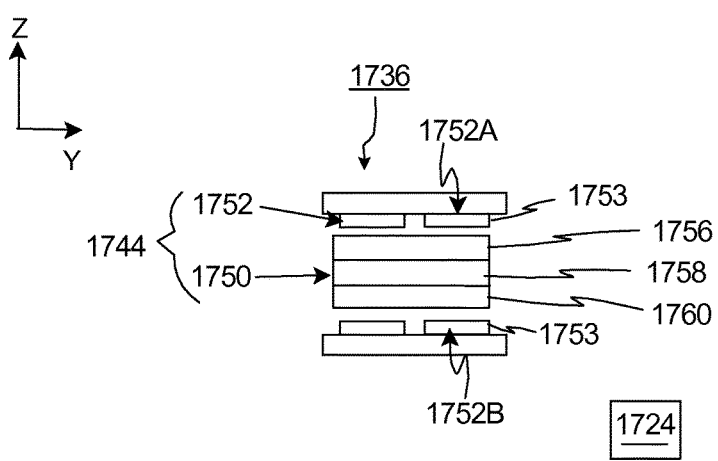
FIG. 17 is a simplified side view of a yet another embodiment of a mover assembly having features of the present invention.

FIG. 17 is a simplified illustration of a portion of yet another embodiment of a control system 1724, and a stage assembly 1736 that includes a stage mover 1744. In this embodiment, the stage mover 1744 is a voice coil motor that includes a magnet array 1752, and a conductor array 1750.

Moreover, in this embodiment, the magnet array 1752 includes (i) a first magnet group 1752A that includes a plurality of magnets 1753; and (ii) a second magnet group 1752B that is spaced apart from the first magnet group 1652A and that includes a plurality of magnets 1753.

Further, the conductor array 1750 includes (i) an upper, first layer of conductors 1756, (ii) a middle, second layer of conductors 1758, and (iii) a lower, third layer of conductors 1760. In this embodiment, (i) the first layer of conductors 1756 is closer to the first magnet group 1752A than the second layer of conductors 1758, (ii) the second layer of conductors 1758 is closer to the first magnet group 1752A than the third layer of conductors 1760, (iii) the third layer of conductors 1760 is closer to the second magnet group 1752B than the second layer of conductors 1758, and (iv) the second layer of conductors 1758 is closer to the second magnet group 1752B than the first layer of conductors 1756. In this embodiment, the control system 1724 directs a first current to the first layer of conductors 1756, a second current to the second layer of conductors 1758, and a third current to the third layer of conductors 1760. In certain embodiments, the first current and the third current are greater than the second current during the movement step to reduce the power consumption. Further, in certain embodiments, the first current is equal to the third current during a movement step.

While a number of exemplary aspects and embodiments of the present invention have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for moving a workpiece a movement step, the method comprising the steps of:

coupling a stage mover to the workpiece, the stage mover including (i) a magnet array having one or more magnet groups, each of the one or more magnet groups including a plurality of magnets that are positioned substantially adjacent to one another; and (ii) a conductor array positioned adjacent to the magnet array, the conductor array including a first layer of conductors and a second layer of conductors that is adjacent to the first layer of conductors, wherein the first layer of conductors is closer to the magnet array than the second layer of conductors, wherein the first layer of conductors is positioned in a stronger magnetic field than the second layer of conductors, wherein the magnet array is positioned on one side of the conductor array, and wherein a first force constant of the first layer of conductors is larger than a second force constant of the second layer of conductors; and directing current to the first layer of conductors and the second layer of conductors independently with a control system, wherein the control system simultaneously directs a first current to the first layer of conductors and a second current to the second layer of conductors, and wherein the first current is greater than the second current during the movement step.

2. The method of claim 1 wherein the step of directing includes directing current so that the first current is at least approximately 1.2 times greater than the second current during the movement step.

3. The method of claim 1 wherein the step of directing includes directing current so that the first current is at least approximately 1.5 times greater than the second current during the movement step.

4. The method of claim 1 wherein the step of directing includes directing current so that the first current is at least approximately two times greater than the second current during the movement step.

5. The method of claim 1 further comprising the step of determining a current ratio using the first force constant of the first layer of conductors and the second force constant of the second layer of conductors, and wherein the step of directing includes using the current ratio to determine the first current and the second current.

6. The method of claim 1 wherein the step of coupling a stage mover includes coupling a planar motor to the workpiece.

7. The method of claim 1 wherein the step of coupling a stage mover includes coupling a linear motor to the workpiece.

8. The method of claim 1 wherein the step of coupling a stage mover includes coupling a voice coil motor to the workpiece.

9. The method of claim 1 wherein the step of coupling includes the stage mover further comprises at least a third layer of conductors, wherein the third layer of conductors is further from the magnet array than the second layer of conductors, and wherein the step of directing current includes the control system also directing a third current to the third layer of conductors, and wherein the second current is greater than the third current during the movement step to reduce the power consumption.

10. The method of claim 1 wherein the step of coupling a stage mover includes the magnet array includes a first magnet group and a second magnet group that is spaced apart from the first magnet group; wherein the stage mover includes a third layer of conductors; wherein the first layer of conductors is closer to the first magnet group than the second layer of conductors, and the second layer of conductors is closer to the first magnet group than the third layer of conductors; wherein the third layer of conductors is closer to the second magnet group than the second layer of conductors, and the second layer of conductors is closer to the second magnet group than the first layer of conductors; and wherein the step of directing current includes the control system directing a third current to the third layer of conductors, and wherein the third current is greater than the second current during the movement step to reduce the power consumption.

11. A stage assembly for moving a workpiece a movement step, the stage assembly comprising:

a stage mover that is coupled to the workpiece, the stage mover including (i) a magnet array having one or more magnet groups, each of the one or more magnet groups including a plurality of magnets that are positioned substantially adjacent to one another; and (ii) a conductor array positioned adjacent to the magnet array, the conductor array including a first layer of conductors and a second layer of conductors that is adjacent to the first layer of conductors, wherein the first layer of conductors is closer to the magnet array than the second layer of conductors, wherein the magnet array is positioned on one side of the conductor array, wherein the first layer of conductors is positioned in a stronger magnetic field than the second layer of conductors, and wherein a first force constant of the first layer of conductors is larger than a second force constant of the second layer of conductors; and a control system that directs current to the first layer of conductors and the second layer of conductors independently, wherein the control system simultaneously directs a first current to the first layer of conductors and a second current to the second layer of conductors, and wherein the first current is greater than the second current during the movement step.

12. The stage assembly of claim 11 wherein the control system directs current so that the first current is at least approximately 1.2 times greater than the second current during the movement step.

13. The stage assembly of claim 11 wherein the control system directs current so that the first current is at least approximately 1.5 times greater than the second current during the movement step.

14. The stage assembly of claim 11 wherein the control system directs current so that the first current is at least approximately two times greater than the second current during the movement step.

15. A stage assembly for moving a workpiece a movement step, the stage assembly comprising:

a stage mover that is coupled to the workpiece, the stage mover including a magnet array and a conductor array positioned adjacent to the magnet array, the conductor array including a first layer of conductors and a second layer of conductors, wherein the first layer of conductors is closer to the magnet array than the second layer of conductors; wherein the first layer of conductors is positioned in a stronger magnetic field than the second layer of conductors, and wherein the magnet array is positioned on only one side of the conductor array; and a control system that directs current to the first layer of conductors and the second layer of conductors independently, wherein the control system simultaneously directs a first current to the first layer of conductors and a second current to the second layer of conductors, wherein the first current is always greater than the second current during the movement step, wherein the control system directs current so that a current ratio between the first current and the second current is greater than one, and wherein the current ratio is approximately equal to the ratio of (i) a resistance of the second layer of conductors multiplied by a first force constant of the first layer of conductors, and (ii) a resistance of the first layer of conductors multiplied by a second force constant of the second layer of conductors.

16. The stage assembly of claim 11 wherein the stage mover is selected from the group that includes a planar motor, a linear motor, and a voice coil motor.

17. The stage assembly of claim 11 wherein the stage mover includes a third layer of conductors, wherein the third layer of conductors is further from the magnet array than the second layer of conductors, and wherein the control system directs a third current to the third layer of conductors, and wherein the second current is greater than the third current during the movement step to reduce the power consumption.

18. The method of claim 1 wherein the step of coupling includes the magnet array being positioned on one side of the conductor array.

19. The method of claim 1 wherein the step of directing current includes the magnet array moving relative to the conductor array during the movement step.

20. The method of claim 1 wherein the step of directing current includes the first current always being greater than the second current during the movement step.

* * * * *